(12) United States Patent
Mayer et al.

(10) Patent No.: US 7,061,770 B2
(45) Date of Patent: Jun. 13, 2006

(54) SYSTEM AND METHOD FOR GUIDINGLY MOUNTING A POWER MODULE TO A PROCESSOR

(75) Inventors: David Mayer, Fort Collins, CO (US); Michael Thornton, Loveland, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 2 days.

(21) Appl. No.: 10/639,276

(22) Filed: Aug. 12, 2003

(65) Prior Publication Data

US 2005/0037658 A1    Feb. 17, 2005

(51) Int. Cl.
*H05K 5/00* (2006.01)
*H05K 5/04* (2006.01)
*H05K 5/06* (2006.01)

(52) U.S. Cl. .................. 361/756; 361/727; 361/741; 439/377

(58) Field of Classification Search ............ 361/715, 361/802, 756, 727, 741, 686; 439/377
See application file for complete search history.

(56) References Cited

U.S. PATENT DOCUMENTS

| | | | |
|---|---|---|---|
| 5,162,979 A | 11/1992 | Anzelone et al. | |
| 5,317,477 A | 5/1994 | Gillett | |
| 5,906,497 A | 5/1999 | Pham et al. | |
| 6,018,465 A | 1/2000 | Borkar et al. | |
| 6,031,715 A | 2/2000 | Magette | |
| 6,166,908 A * | 12/2000 | Samaras et al. | ............ 361/700 |
| 6,178,624 B1 | 1/2001 | Magette | |
| 6,208,523 B1 | 3/2001 | Bertolami et al. | |
| 6,307,747 B1 | 10/2001 | Farnsworth et al. | |
| 6,392,899 B1 * | 5/2002 | Harrison et al. | ............ 361/803 |
| 6,437,979 B1 | 8/2002 | Unrein | |

* cited by examiner

*Primary Examiner*—Kamand Cuneo
*Assistant Examiner*—Hung S. Bui

(57) ABSTRACT

A system having a power module mount adapted to support a power module side-by-side with a card-based processor, and a connectivity guide adapted to guide the power module along a direct path between electrically connected and disconnected relationships with the card-based processor. A method for mounting a power module to a processor involving engaging the power module with a connectivity guide disposed adjacent the processor, moving the power module toward the processor via the connectivity guide, and mating edge connectors of the power module and the processor.

24 Claims, 7 Drawing Sheets

SYSTEM AND METHOD FOR GUIDINGLY MOUNTING A POWER MODULE TO A PROCESSOR

BACKGROUND OF THE INVENTION

A variety of systems and devices, such as computers, use processors for task-specific functions, application-specific management, and central processing. Depending on the particular application, one or more components may be directly or indirectly connected to the processors on a circuit board. In certain processor architectures, such as the Intel Itanium processor family, a power module is directly coupled to the processor via a card edge connector. Unfortunately, the process of mounting the power module to the processor may cause damage to the power module, the processor, the underlying circuit board, or other system components.

SUMMARY

According to one embodiment of the invention, a system comprises a power module mount adapted to support a power module side-by-side with a card-based processor. The system also comprises a connectivity guide adapted to guide the power module along a direct path between electrically connected and disconnected relationships with the card-based processor.

In another embodiment, a processor-based device comprises a processor having a card edge connector. The processor-based device also has a lateral mounting guide having a guide path aligned substantially perpendicular with the card edge connector. The processor-based device also comprises a power module disposed on the lateral mounting guide side-by-side with the processor, wherein the power module has a connector receptacle mated with the card edge connector.

In a further embodiment, a system comprises means for supporting a power module adjacent a processor. The system also comprises means for guiding edge-connectivity between the power module and the processor.

Another embodiment comprises a method for mounting a power module to a processor. The method comprises engaging the power module with a connectivity guide disposed adjacent the processor. The method also comprises moving the power module toward the processor via the connectivity guide, and mating edge connectors of the power module and the processor.

BRIEF DESCRIPTION OF THE DRAWINGS

Exemplary embodiments will hereafter be described with reference to the accompanying drawings, wherein like reference numerals denote like elements, and.

DETAILED DESCRIPTION

Figure 1:
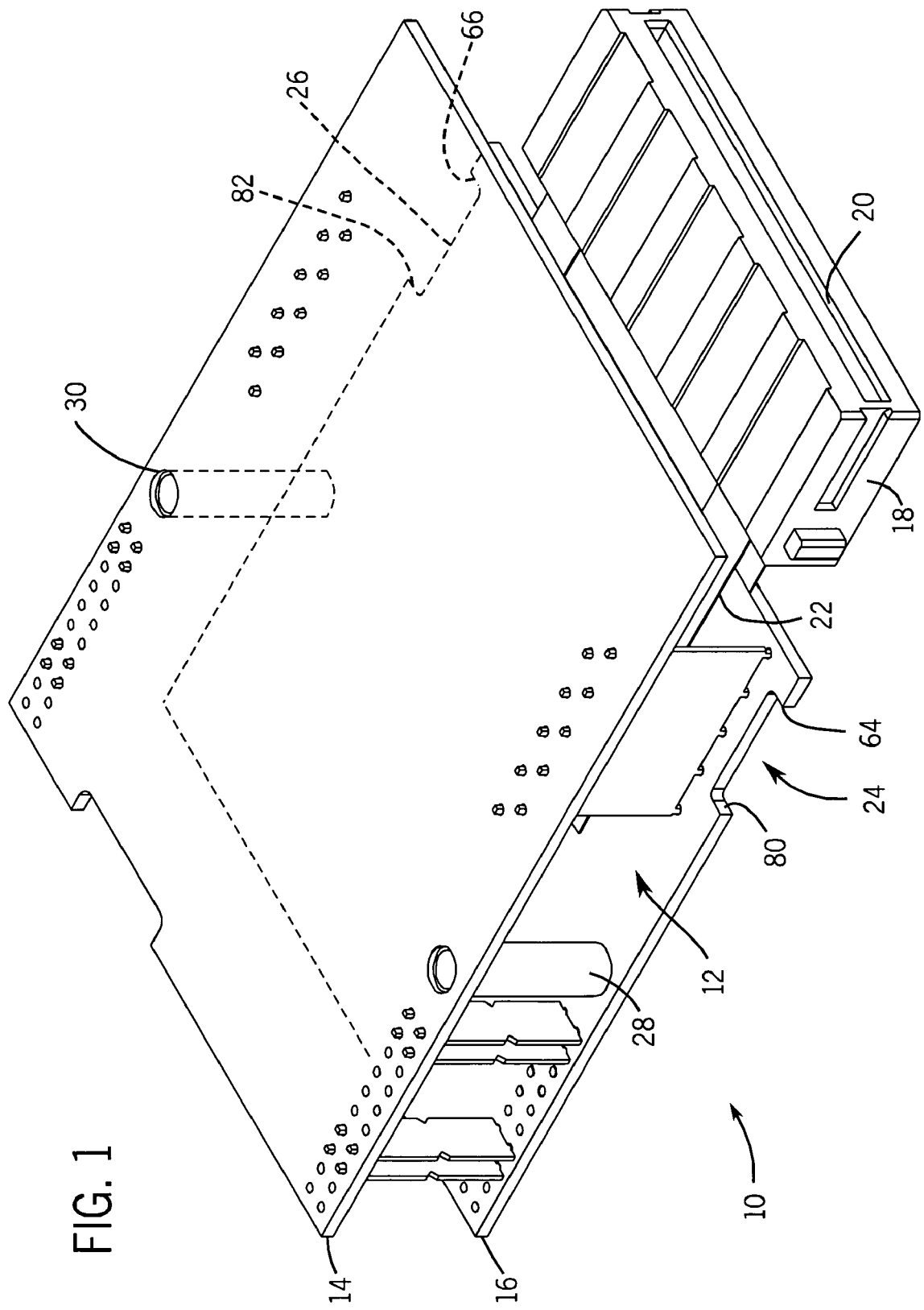
FIG. 1 is a perspective view illustrating a power module in accordance with certain embodiments of the present invention.

FIG. 1 is a perspective view illustrating a power module 10 in accordance with certain embodiments of the present invention. As illustrated, the power module 10 comprises a plurality of circuitry and power components 12 (e.g., AC/DC converter with power logic) disposed between boards 14 and 16 with an open-frame or frameless perimeter. However, any suitable frame structure may be provided about the boards 14 and 16 if additional support is desired around the perimeter of the boards 14 and 16. In the illustrated embodiment, the open-frame may facilitate heat transfer and cooling of the circuitry and power components 12, particularly where an airflow is passed through the power module 10. A heat sink also may be provided to facilitate heat transfer. However, the power module 10 may be maintained at a desirable operating temperature without a heat sink or with a relatively smaller heat sink.

The power module 10 also has an electrical connector module 18 communicatively coupled to the circuitry and power components 12. As illustrated, the electrical connector module 18 comprises a card edge receptacle 20 having female electrical connectors (not shown) that are mateable with male electrical connectors of a mating electrical connector (e.g., a card edge of a card-based processor). The electrical connector module 18 may be coupled with the power module 10 via a cable 22, such as a flexible cable or ribbon cable, which provides a degree of movement to facilitate a connection between the electrical connector module 18 and a mating electrical connector. In the illustrated embodiment, the cable 22 has a length short enough to provide some movement without a support bracket.

Additionally, the power module 10 may comprise a variety of mounting and connectivity guides and/or linear positioning mechanisms to facilitate the connection between the electrical connector module 18 and a mating electrical connector. For example, the illustrated power module 10 has guide notches or slots 24 and 26 to facilitate linear positioning along a mating guide member (not shown). Any other guides or positioning mechanisms are also within the scope of the present technique. The foregoing guides also may reduce the likelihood of physical damage to adjacent components during installation and removal of the power module 10. For example, the guides may limit travel (e.g., prevent over-travel) of power module 10, such that the power module 10 cannot contact adjacent components. The power module 10 also may have one or more mount securing mechanisms. For example, the illustrated power module 10 may comprise fastener supports or passageways 28 and 30, which facilitate the insertion of a fastener through the power module 10 and securably into the desired mounting support or circuit board.

Figure 2:
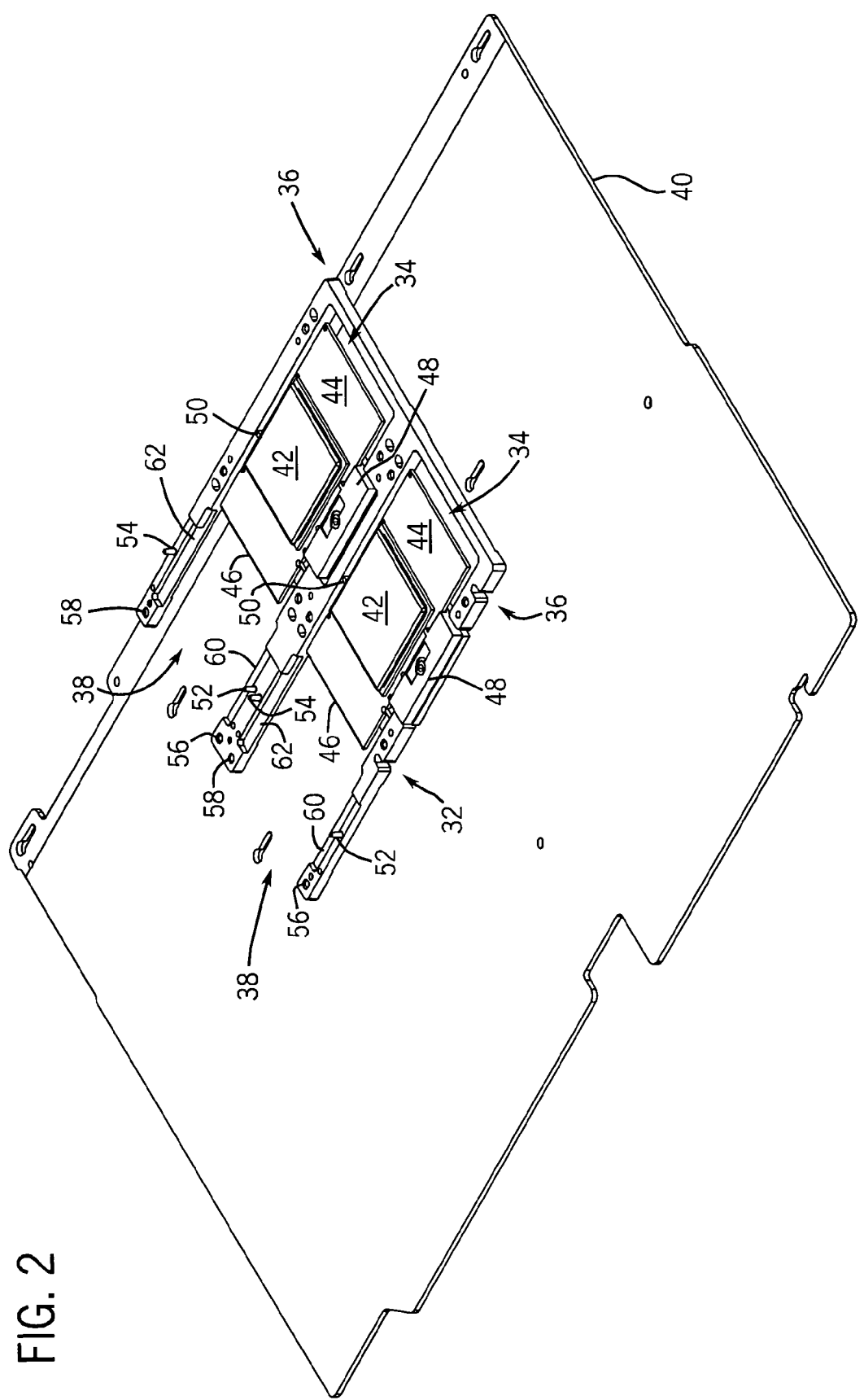
FIG. 2 is a perspective view illustrating a mounting support for mounting the power module of FIG. 1 to one of a pair of card-based processors in accordance with certain embodiments of the present invention.

FIG. 2 is a perspective view illustrating a mounting support 32 for mounting the power module 10 of FIG. 1 to one of a pair of card-based processors 34 in accordance with certain embodiments of the present invention. As illustrated, the mounting support 32 is an integral processor-power module mount comprising a pair of processor mounts 36 disposed side-by-side with a pair of power module mounts 38 on a circuit board 40. If desired, the processor mounts 36 may be separated from the power module mounts 38. Any suitable integral or separated configuration of the mounts is within the scope of the present technique. Each of the illustrated card-based processors 34 comprises a processor 42 disposed on a card 44 having a card edge connector 46 (e.g., mating electrical connectors insertable into the electrical connector module 18 of the power module 10). For example, the card-based processors 34 may comprise an Itanium processor manufactured by Intel Corporation of Santa Clara, Calif. In the illustrated embodiment, the card-based processors 34 are mounted to the processor mounts 36 via retention mechanisms 48 and 50, which extend over opposite edges of the cards 44. In this mounted configuration, the card edge connectors 46 of the card-based processors 34 are directed toward the power module mounts 38. In conjunction with the guides and positioning mechanisms of the power module 10, the power module mount 38 also may have a variety of mating mount and connectivity guides and/or linear positioning mechanisms to facilitate the connection between the electrical connector module 18 and the card edge connectors 46.

For example, the illustrated power module mounts 38 may comprise male mount guides or guiding posts 52 and 54, which guide movement of the power module 10 along the power module mount 38 via interaction with the slots 24 and 26, respectively. Any other guides or positioning mechanisms are also within the scope of the present technique. The power module mounts 38 also may have one or more mount securing mechanisms for the power module 10. For example, the illustrated power module mounts 38 may comprise fastener supports or receptacles 56 and 58, such as threaded receptacles. As discussed below, a fastener may be inserted through the passageways 28 and 30 of the power module 10 and secured in the receptacles 56 and 58, such that the power module 10 is secured to the power module mount 38. The power module mounts 38 may include notches or recessed structures 60 and 62 to accommodate circuitry on the board 16 of the power module 10.

Figure 3:
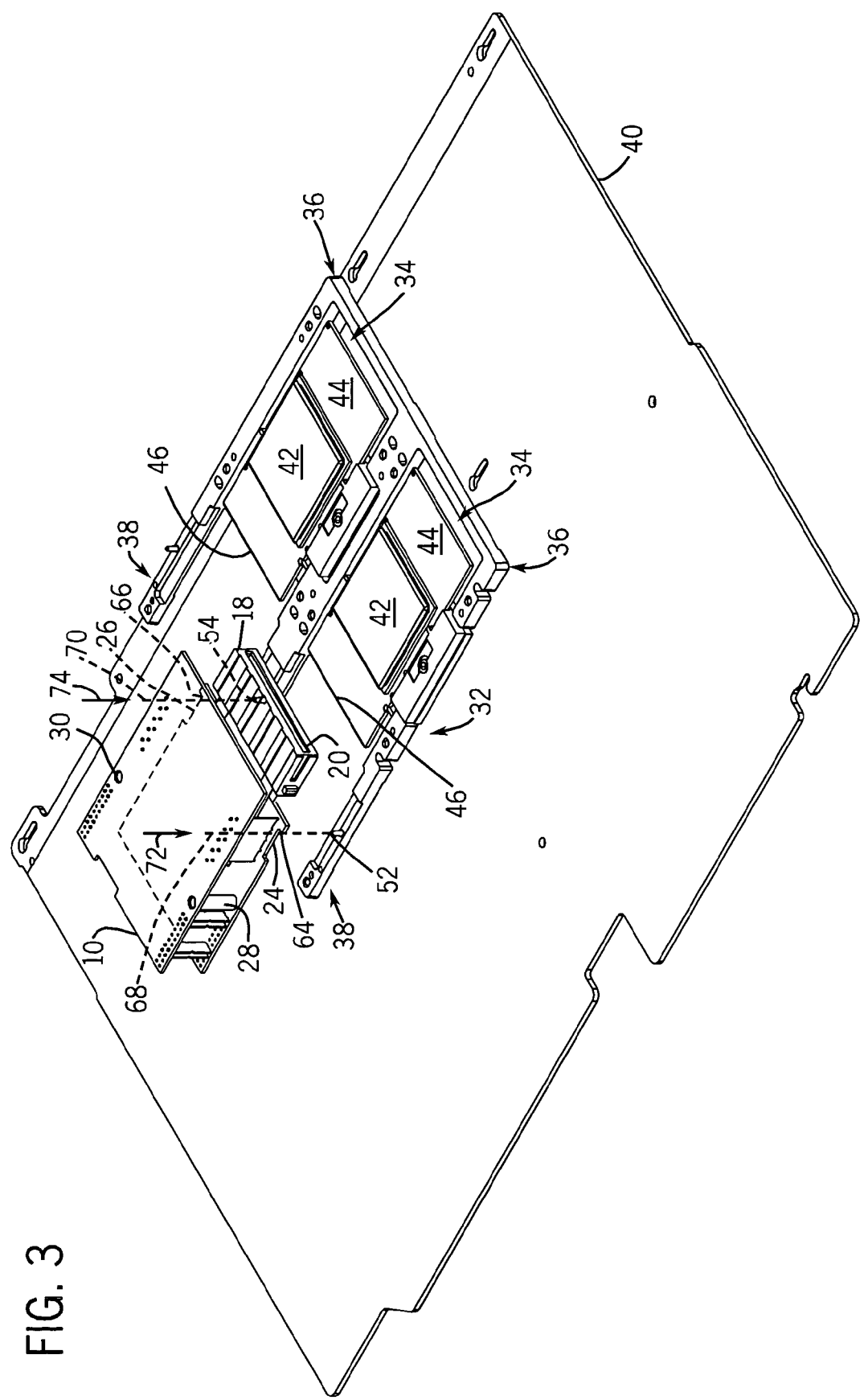
FIG. 3 is a perspective view illustrating an embodiment having the power module of FIG. 1 being engaged with the mounting support of FIG. 2.

FIG. 3 is a perspective view illustrating an embodiment having the power module 10 of FIG. 1 being engaged with the mounting support 32 of FIG. 2. As illustrated, the power module 10 is positioned over the power module mount 38 such that front portions 64 and 66 of the guide slots 24 and 26 are aligned with the guide posts 52 and 54, as illustrated by alignment lines 68 and 70. The power module 10 may then be lowered onto the power module mount 38, as indicated by arrows 72 and 74. As the power module 10 is lowered onto the power module mount 38, the guide posts 52 and 54 extend into the guide slots 24 and 26 at the front portions 64 and 66 such that a degree of clearance is maintained between the electrical connector module 18 and the card edge connector 46. Accordingly, the foregoing process may substantially reduce the likelihood of physical damage to the power module 10, the card-based processor 42, the circuit board 40, and other components during mounting of the power module 10. For example, the engagement of the guide posts 52 and 54 with the guide slots 24 and 26 may limit the motion of the power module 10 to a positional range clearing or avoiding adjacent components.

Figure 4:
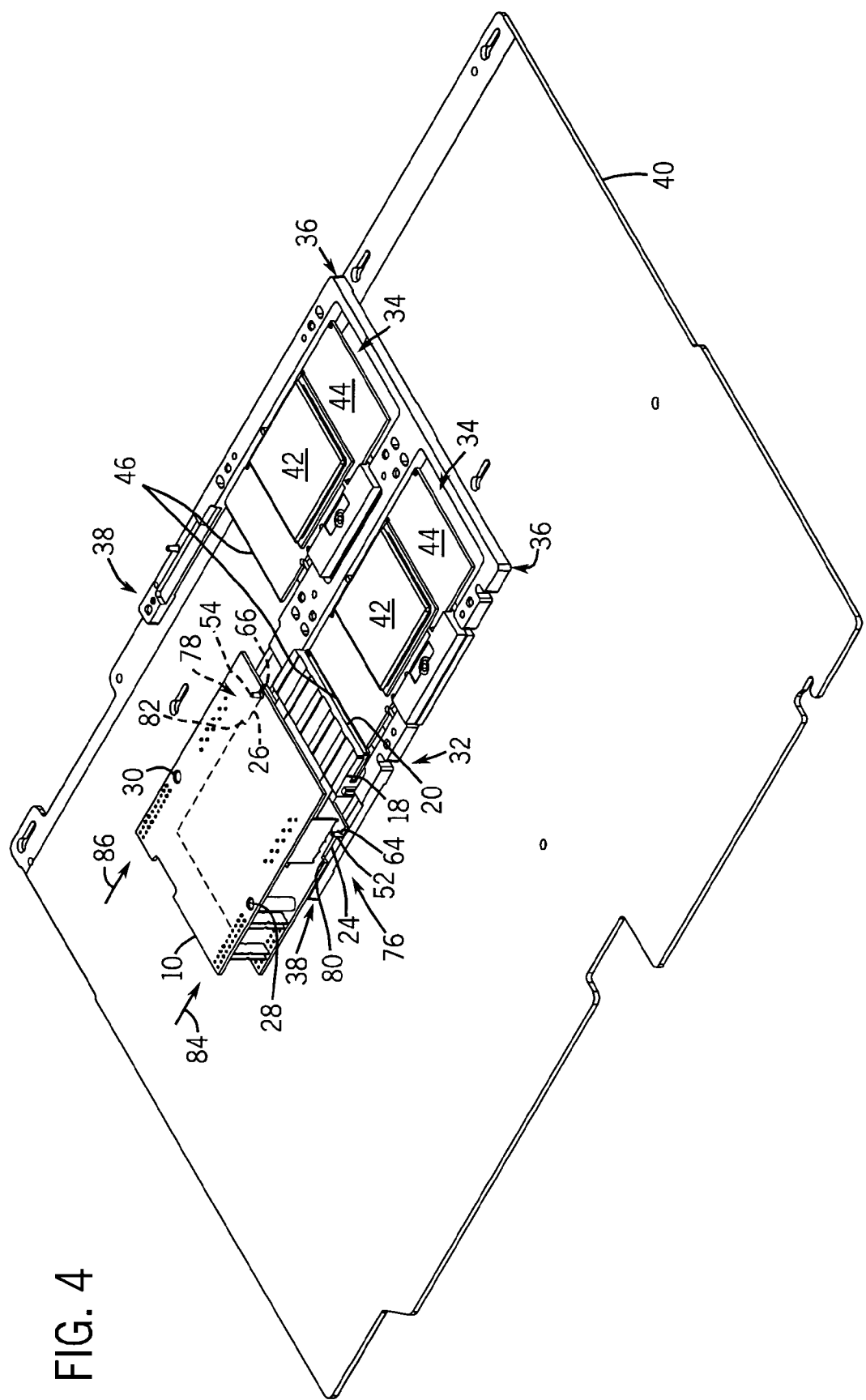
FIG. 4 is a perspective view illustrating an embodiment having the power module of FIG. 1 guidingly disposed on the mounting support of FIG. 3 and unconnected from the card-based processors.

FIG. 4 is a perspective view illustrating an embodiment having the power module of FIG. 1 guidingly disposed on the mounting support 32 of FIG. 3 and unconnected from the card-based processor 42. In this mounted position, the guide slots 24 and 26 interact with the guide posts 52 and 54 to guide the power module 10 directly to/from the card-based processor 34. Accordingly, the combination of guide slots 24 and 26 and guide posts 52 and 54 may be collectively referred to as connectivity guides or lateral mounting guides 76 and 78, which facilitate an electrical connection between the card edge receptacle 20 of the power module 10 and the card edge connector 46 of the card-based processor 34. As mentioned above, the guides 76 and 78 may comprise any other suitable guiding or positioning mechanism within the scope of the present technique. For example, the guides 76 and 78 may comprise a rail and slider movable along the rail, a key-hole slot and boss interlockable into the key-hole slot, a linear pathway and a leverage member adapted to move the card-based processor 42 along the linear pathway, and so forth. In the illustrated embodiment, the connectivity guides or lateral mounting guides 76 and 78 are configured to provide linear motion aligned substantially perpendicular with the card edge connector 46, thereby reducing undesirable stresses associated with an indirect connection motion. The guides 76 and 78 also limit side-to-side or lateral movement of the card-based processor 42 to protect adjacent components and circuitry.

The guides 76 and 78 also may have a limited range of motion to reduce over-extending or under-extending the power module 10 along the power module mount 38. For example, as discussed above, the front portions 64 and 66 of the guide slots 24 and 26 may act to maintain a desired clearance between the electrical connector module 18 and the card edge connector 46 during mounting and dismounting of the power module 10. Moreover, the guide slots 24 and 26 may have rear portions 80 and 82 to set the desired connection depth between the card edge receptacle 20 and the card edge connector 46. As defined by these front portions 64–66 and rear portions 80–82 of the guide slots 24 and 26, the power module 10 may move along the guide posts 52 and 54 between unconnected and connected configurations. Arrows 84 and 86 illustrate a straight-on guided motion for connecting the card edge receptacle 20 of the power module 10 with the card edge connector 46 of the card-based processor 34.

Figure 5:
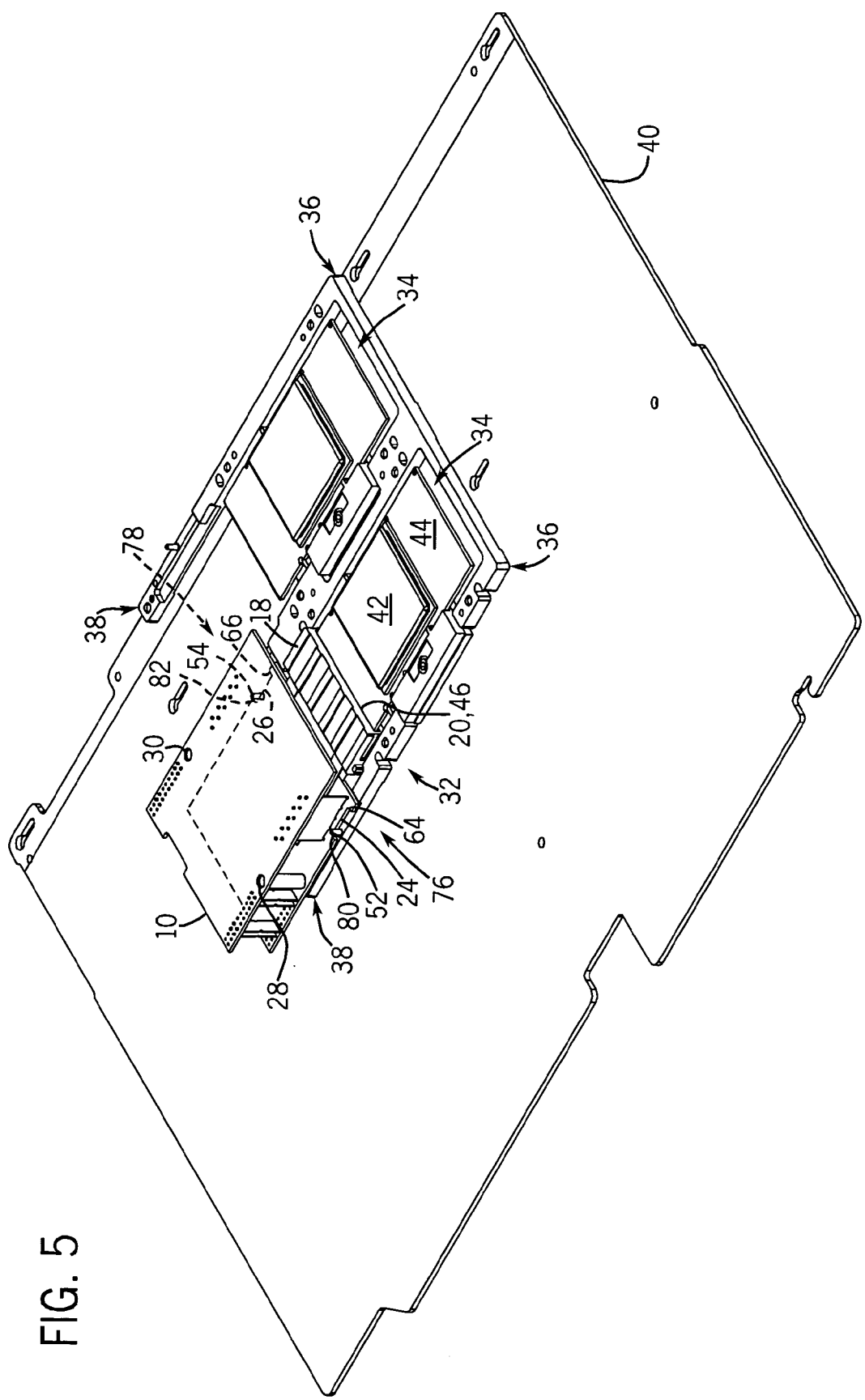
FIG. 5 is a perspective view illustrating an embodiment having the power module of FIG. 1 guidingly disposed on the mounting support of FIG. 3 and connected with the card-based processors.

FIG. 5 is a perspective view illustrating an embodiment having the power module of FIG. 1 guidingly disposed on the mounting support of FIG. 3 and connected with the card-based processor 42. As illustrated, the card edge connector 46 of the card-based processor 34 is inserted into the card edge receptacle 20 of the power module 10 at a connection depth, which may be defined by the range of motion provided by the rear portions 80 and 82 of the guide slots 24 and 26. If removal is desired, then the power module 10 may be moved directly away from the card-based processor 34 along the guides 76 and 78 until the guide posts 52 and 54 abut the front portions 64 and 66. The power module 10 may then be lifted up and away from the power module mount 38. Otherwise, the power module 10 may be further secured to the mounting support 32 via any suitable retainer or securement mechanism.

Figure 6:
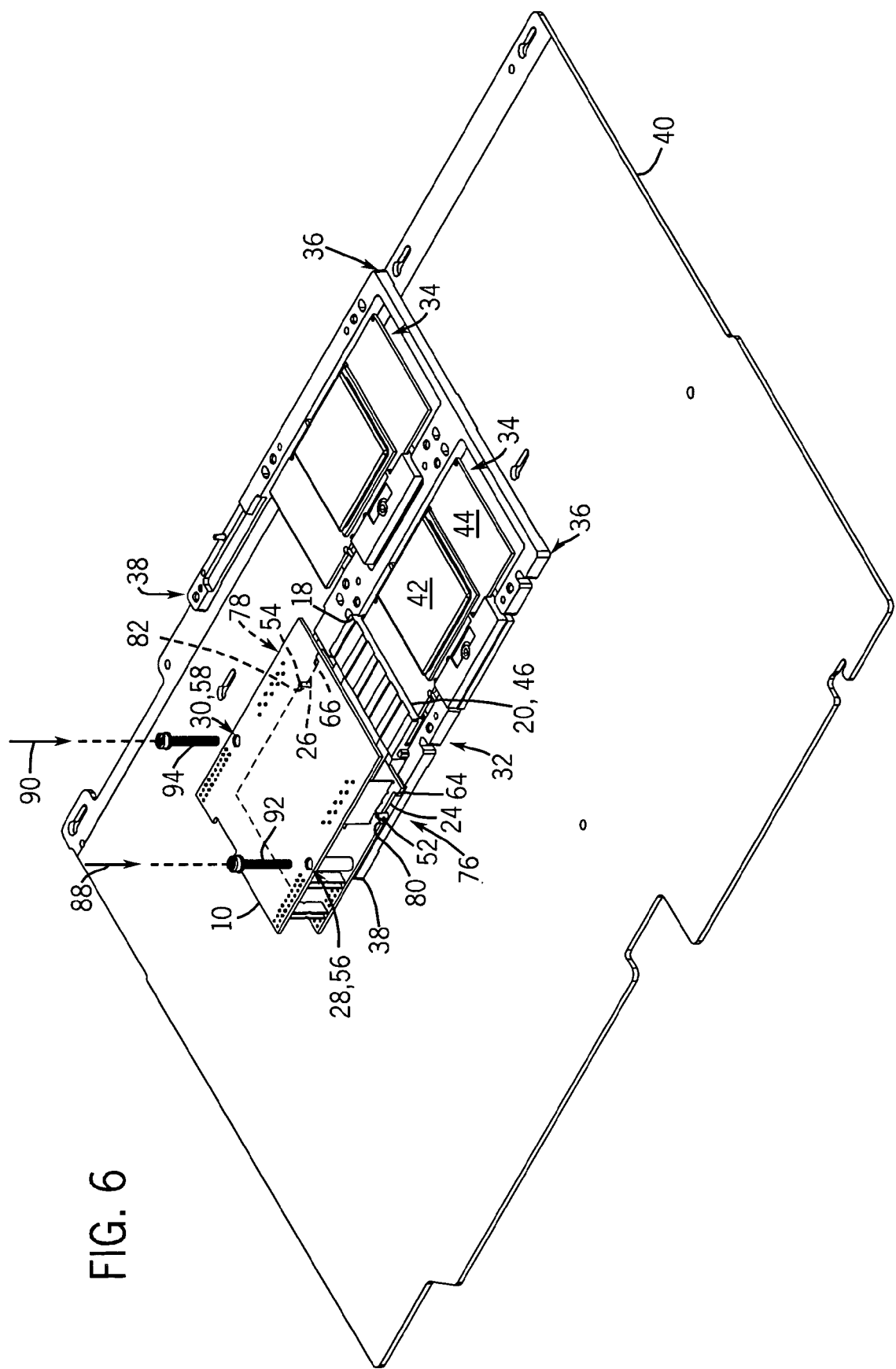
FIG. 6 is a perspective view illustrating an embodiment having the power module of FIG. 1 being retained to the mounting support of FIG. 3 in the electrically connected configuration of FIG. 5.

FIG. 6 is a perspective view illustrating an embodiment having the power module of FIG. 1 retained by the mounting support of FIG. 3 in the electrically connected configuration of FIG. 5. As illustrated by arrows 88 and 90, the power module 10 may be secured in the connected configuration by inserting fasteners 92 and 94 through passageways 28 and 30 of power module 10 and into receptacles 56 and 58 of power module mount 38. For example, the fasteners 92 and 94 may comprise an externally threaded fastener (e.g., a screw or bolt), a pin, a snap-fit member, a latch, or any other suitable fastening mechanism. If removal is desired, the fasteners 92 and 94 may be withdrawn from the receptacles 56 and 58 and passageways 28 and 30. The power module 10 may then be moved directly away from the card-based processor 34 along the guides 76 and 78 until the guide posts 52 and 54 abut the front portions 64 and 66. Once at the front portions 64 and 66, the power module 10 may be lifted up and away from the power module mount 38.

Figure 7:
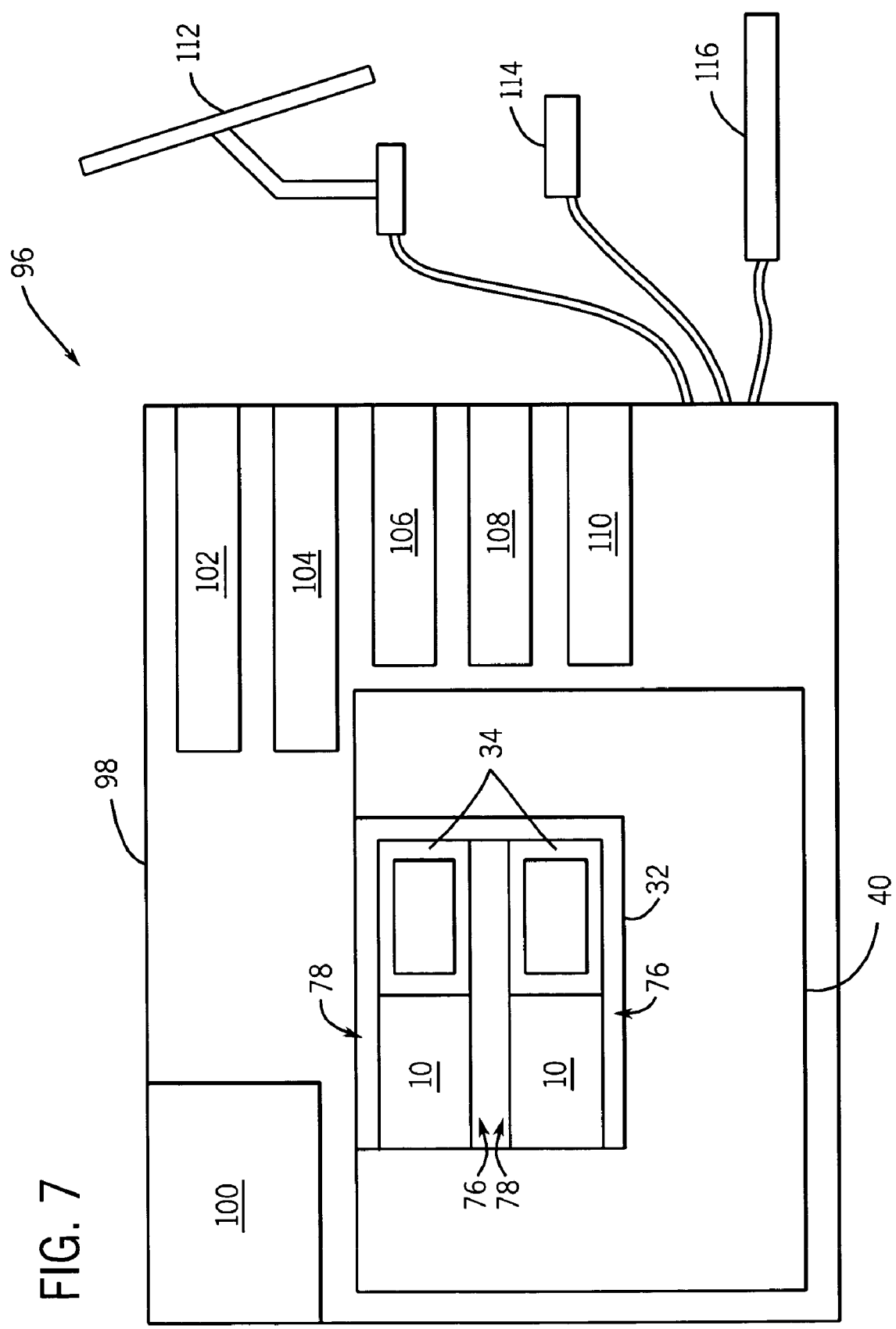
FIG. 7 is a perspective view illustrating an embodiment of a processor-based device having the power module and mounting support illustrated in FIGS. 1–6.

As discussed above, the mounting support 32 and guides 76 and 78 may be utilized in a variety of systems and devices. FIG. 7 is a perspective view illustrating an embodiment of a processor-based device 96 having the power module 10, guides 76 and 78, and mounting support 32 illustrated in FIGS. 1–6. As illustrated, the processor-based device 96 comprises a computer housing 98 having a plurality of communicatively coupled components, such as the circuit board 40, a pair of the card-based processors 34, a pair of the power modules 10 mounted with the processors 34 via the guides 76 and 78, a power supply 100, optical drives 102 and 104, a floppy disk drive 106, and hard disk drives 108 and 110. The processor-based device 96 also may have a variety of peripheral devices, such as a display 112, a pointing device 114, and a keyboard 116. Any other desired internal or external components are also within the scope of the present technique.

What is claimed is:

1. A system, comprising:
   a power module mount adapted to support a power module side-by-side with a card-based processor; and
   a connectivity guide adapted to guide the power module edgewise between electrically connected and disconnected relationships with the card-based processor, wherein the connectivity guide comprises a range of guided movement that is oriented substantially parallel to a plane extending lengthwise through the card-based processor.

2. The system of claim 1, wherein the power module comprises a first guide portion of a linear positioning guide and the power module mount comprises a second guide portion of the linear positioning guide.

3. The system of claim 1, wherein the connectivity guide comprises male and female linear positioning mechanisms.

4. The system of claim 3, wherein the male and female linear positioning mechanisms comprise a guide post and a guide slot.

5. The system of claim 1, comprising a fastener adapted to retain the power module in the electrically connected relationship.

6. The system of claim 1, wherein the connectivity guide provides linear motion aligned substantially perpendicular with a card edge connector of the card-based processor.

7. A processor-based device, comprising:
   a processor having a card edge connector;
   a mounting guide; and
   a power module disposed on the mounting guide side-by-side with the processor, wherein the power module has a connector receptacle mated with the card edge connector, wherein the mounting guide comprises a guide path between the card edge connector and the connector receptacle, and the guide path is oriented substantially parallel to a plane extending lengthwise through the processor.

8. The processor-based device of claim 7, wherein the mounting guide limits travel of the power module while the power module is being connected to the processor.

9. The processor-based device of claim 7, wherein the mounting guide comprises a linear positioning mechanism.

10. The processor-based device of claim 7, wherein the mounting guide limits lateral movement of the power module when the card edge connector engages or disengages the connector receptacle.

11. The processor-based device of claim 10, wherein the mounting guide comprises at least one guide slot disposed on the power module and mated with the at least one guide post.

12. The processor-based device of claim 7, wherein the power module is frameless.

13. The processor-based device of claim 7, wherein the mounting guide is adapted to provide engagement in a first direction between the power module and the processor and simultaneously inhibit movement of the power module in a second direction perpendicular to the first direction.

14. The processor-based device of claim 7, wherein the mounting guide prohibits movement in a direction transverse to a plane extending lengthwise through a card supporting the processor, and wherein the card comprises the card-edge connector.

15. A system, comprising:
    means for supporting a power module adjacent a processor; and
    means for guiding edge-connectivity between the power module and the processor, wherein the means for guiding edge-connectivity provides motion substantially parallel with a plane extending lengthwise through a card supporting the processor, and wherein the motion is substantially perpendicular to a card connector disposed on an edge of the card.

16. The system of claim 15, wherein the means for supporting comprise a mounting support adapted to mount the power module side-by-side with the processor on a circuit board.

17. The system of claim 15, wherein the means for guiding comprise a guide slot movable along a guide post in a direct path between the power module and the processor.

18. A method for mounting a power module to a processor, comprising:
    engaging the power module with a connectivity guide disposed adjacent the processor;
    moving the power module toward the processor along a guide path of the connectivity guide, wherein the guide path is oriented substantially parallel to a plane extending lengthwise through the processor; and
    mating edge connectors of the power module and the processor.

19. The method of claim 18, wherein engaging comprises positioning the power module on a power module mount disposed on a circuit board side-by-side with the processor.

20. The method of claim 18, wherein engaging comprises positioning the power module on a linear positioning mechanism of the connectivity guide.

21. The method of claim 20, wherein positioning comprises inserting a guide post into a guide slot.

22. The method of claim 18, wherein moving comprises laterally moving the edge connectors straight toward one another.

23. The method of claim 18, wherein mating comprises inserting a card edge connector of the processor into a card edge receptacle of the power module.

24. The method of claim 18, comprising prohibiting movement via the connectivity guide of the power module in a direction transverse to a plane extending lengthwise through a card supporting the processor.

* * * * *